United States Patent [19]

de Jager

[11] 4,420,723
[45] Dec. 13, 1983

[54] PHASE LOCKED LOOP AMPLIFIER FOR VARIABLE AMPLITUDE RADIO WAVES

[75] Inventor: Frank de Jager, Eindhoven, Netherlands

[73] Assignee: U.S. Philips Corporation, New York, N.Y.

[21] Appl. No.: 248,607

[22] Filed: Mar. 27, 1981

[30] Foreign Application Priority Data

Apr. 1, 1980 [NL] Netherlands .................... 8001903

[51] Int. Cl.$^3$ .............................................. H03F 3/38
[52] U.S. Cl. ...................................... 330/10; 330/103; 331/2; 331/15
[58] Field of Search ................... 330/10, 103; 455/7; 329/122; 331/2, 15, 23, 25

[56] References Cited

U.S. PATENT DOCUMENTS

| 3,873,931 | 3/1975 | Basse et al. | 329/122 |
| 3,896,395 | 7/1975 | Cox | 330/10 |
| 3,927,379 | 12/1975 | Cox et al. | 330/10 |
| 4,178,557 | 12/1979 | Henry | 330/10 |

OTHER PUBLICATIONS

Cassera, F. A., et al., "Suppression of Interchannel Interferrence in FM Receivers", Canadian Communications and Power Conference, Montreal, Canada, Oct. 20-22, 1976, pp. 63-65.

Primary Examiner—Siegfried H. Grimm
Assistant Examiner—W. R. Paxman
Attorney, Agent, or Firm—Thomas A. Briody; William J. Streeter; Edward W. Goodman

[57] ABSTRACT

A modulated carrier signal, the amplitude variations of which are smaller than the amplitude of the unmodulated carrier, is not very suitable for transmission over radio links because the required use of non-linear components, such as class-C amplifiers, result in an unwanted widening of the transmitted spectrum. According to the invention an arrangement for amplifying such a signal comprises two oscillators (16, 17) the desired relative phase of which is adjusted in a loop including a control circuit 22. On combining the oscillator signals $v'_k$ and $v'_g$, there is produced a resulting signal r which is a replica of the input signal v having the amplitude variations. As the oscillators 16 and 17 produce signals having a constant amplitude, these signals can be easily amplified, for example by class-C amplifiers.

7 Claims, 9 Drawing Figures

PHASE LOCKED LOOP AMPLIFIER FOR VARIABLE AMPLITUDE RADIO WAVES

BACKGROUND OF THE INVENTION

The invention relates to an arrangement suitable for amplifying a modulated carrier signal the amplitude variations of which are smaller than the amplitude of the unmodulated carrier.

In recent years numerous modulation methods aimed at achieving efficient data transmission over telephone lines have been designed and introduced. In almost all cases these modulation methods have resulted in a modulated carrier signal having amplitude variations (i.e. amplitude modulation), using linear modulators and amplifiers.

However, these modulation methods are not so suitable for data transmission over radio links because, in radio communication systems, the need for high power economy requires the use of components having a non-linear amplitude transfer function and the spectrum at the output of such a component, for example a class C amplifier, will be wider than the spectrum at the input when the amplitude at the input varies. Therefore, in radio communication systems, preference is given to modulation methods which result in a modulated carrier signal of a substantially constant amplitude, which means the use of angle modulation. See, for example, the article "Tamed Frequency Modulation, a novel method to achieve spectrum economy in digital transmission" by F. de Jager, C. B. Dekker, in IEEE Transactions on Communications, vol. COM-26, No. 5, May 1978, pages 534–542.

SUMMARY OF THE INVENTION

The invention has for its object to provide an arrangement of the type referred to, by which a modulated carrier signal having amplitude variations is amplified, the arrangement allowing the use of components having a non-linear amplitude transfer function—such as class-C amplifiers—while the spectrum at the output of the arrangement is not wider, to any significant extent, than at the input.

According to the invention, an arrangement of the type referred to is characterized by comprising a first and a second controlled oscillator, each having a control input and an output, which oscillators are connected by means of their respective control inputs to a control circuit and oscillate at a substantially constant amplitude and at a frequency which substantially corresponds to the carrier frequency, the output of each oscillator being coupled to the control circuit for generating control signals for the oscillators from comparisons between the modulated carrier signal and the oscillator signals, the arrangement also having an output circuit connected to the outputs of the oscillators for vectorially assembling an output signal.

The arrangement suitable for amplifying a modulated carrier signal in accordance with the invention may be further characterized in that: the control circuit comprises a first and a second phase comparator circuit, each having a first and a second input and an output, together with a first and a second low-pass filter; that the output of the first oscillator is connected to the second input of the first phase comparator circuit and the output of the first phase comparator circuit is connected to the control input of the first oscillator through the first low-pass filter; that the output of the second oscillator is connected to the second input of the second phase comparator circuit and the output of this second phase comparator circuit is connected to the control input of the second oscillator through the second low-pass filter; that the control circuit further comprises a first and a second adder circuit, each having a first and a second input and an output, together with a first and a second delay element; that the first input of the two adder circuits are interconnected and connected to an input of the arrangement; that the second input of the first adder circuit is connected to the output of the second oscillator through the first delay element and the output of the first adder circuit is connected to the first input of the first phase comparator circuit; and that the second input of the second adder circuit is connected to the output of the first oscillator through the second delay element and the output of the second adder circuit is connected to the first input of the second phase comparator circuit.

It should be noted here that such a control circuit is indeed disclosed in U.S. Pat. No. 3,873,931, but said patent specification relates to a FM demodulator for separating the useful, original, transmitted signal from the noise signal.

BRIEF DESCRIPTION OF THE DRAWINGS

Embodiments of the invention and their advantages will now be further explained by way of example with reference to the accompanying drawings.

In the drawings:

FIG. 2b is a phase diagram for illustrating the operation of FIG. 2a;

FIG. 2c shows an output circuit for use in the first embodiment shown in FIG. 2a;

Corresponding elements in the Figures have been given the same reference symbols.

DESCRIPTION OF THE PREFERRED EMBODIMENTS (1) General description

Figure 1A:
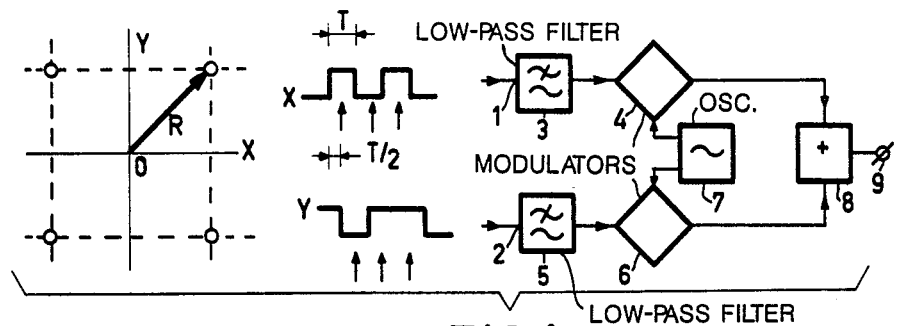
FIG. 1a is a block schematic circuit diagram of a known modulation stage.
Figure 1B:
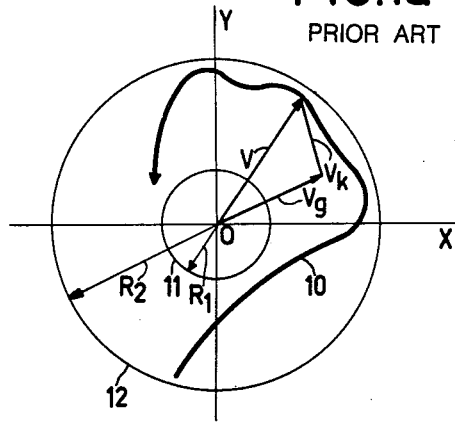
FIG. 1b shows the variation of a signal vector in the phase plane.

FIG. 1a shows a block schematic circuit diagram of a known modulation stage for a modulation method which is referred to in the literature as "Offset Quadrature Phase Shift Keying," abbreviated to OQPSK (see the article "Effect of noisy phase reference on coherent detection of offset QPSK signals" by S. A. Rhodes, in IEEE Transactions on Communications, vol. COM-22, No. 8, August 1974, pages 1046–1055). This modulation method differs from quadrature-phase modulation in that the data signal of the Y-channel is shifted by a time T/2 with respect to the X-channel data signal. As a result, the X- and Y-channels must be sampled in a receiver at different instants, for example at the instants as indicated by means of the arrows in the data signals X and Y of FIG. 1a. The modulation stage has an input 1 for data signal X and an input 2 for data signal Y. After filtering by a low-pass filter 3, the signal X is applied to an input of a modulator 4. After filtering by a low-pass filter 5, the signal Y is applied to an input of a modulator 6. Signals from a carrier oscillator 7 are applied to a further input of modulators 4 and 6, respectively, these signals having a relative phase of 0° and 90°, respectively. The output signals of the modulators 4 and 6 are added together in an adder 8 and applied to an output 9. The signal vector of the modulated carrier signal available at the output 9 has the property that the amplitude variations are smaller than the unmodulated carrier amplitude. To illustrate this, FIG. 1b shows, in the phase plane, a portion of a path 10 of the signal vector v. It is seen that the amplitude of signal vector v is invariably situated in the area between the circles 11 and 12, which have a radius R1 and R2, respectively, wherein R2>R1>0.

In practice, it appears that for OQPSK the radius R1 is approximately equal to 0.5 R and the radius R2 is approximately equal to 1.5 R, R being the distance from the origin to the characteristic phase points in 4-phase modulation. When the input signals X and Y have the value +1 or −1 at the sampling instants, R is equal to $\sqrt{2}$.

In the arrangement according to the invention, use is made of the property that the final point of the signal vector v remains at a certain distance from the origin (in OQPSK even at a considerable distance, as described above).

It should be noted that, in addition to OQPSK, the invention is also applicable to other modulation methods used for digital signals, provided the indicated property is present. It further appears that the principle described hereinafter may alternatively be used for analog signals, single-side band signals in particular. By way of example, the invention will be further explained with reference to the example of OQPSK given in FIG. 1a, although the invention is not restricted thereto.

As shown in FIG. 1b, the arbitrary final point of the signal vector v may be represented by giving two vectors $v_g$ and $v_k$, each having a constant amplitude and consequently a fixed amplitude ratio with respect to each other, in order to produce the desired phase angles. If, for example, a value 0.6 $v_g$ is chosen for $v_k$, then the amplitude of the resulting vector v may be varied by a factor of 4 between minimum and maximum amplitudes, which is sufficient to handle the 3 to 1 amplitude ratio of 1.5 R:0.5 R as required for OQPSK.

(2) Detailed Description

Figure 2A:
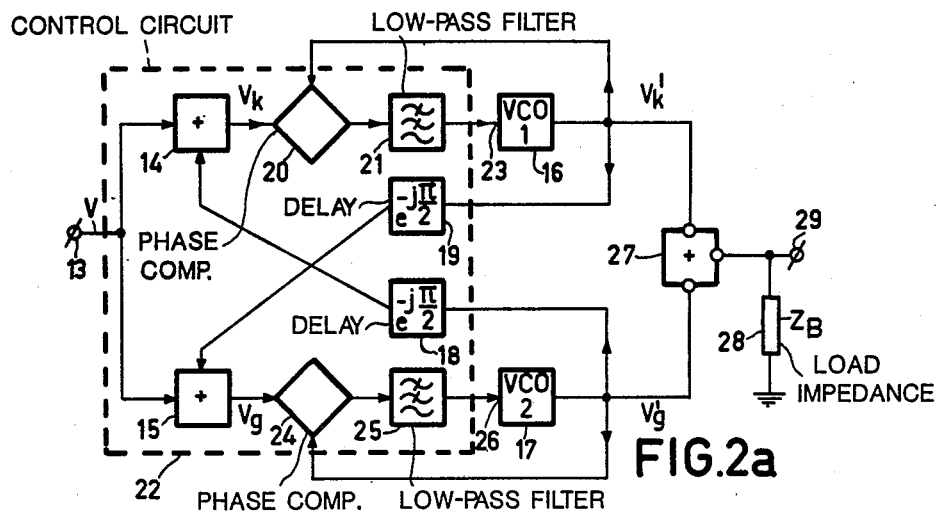
FIG. 2a is a block schematic circuit diagram of a first embodiment of an arrangement according to the invention.

FIG. 2a shows a block schematic circuit diagram of a first embodiment of an arrangement according to the invention. The arrangement comprises a first voltage-controlled oscillator 16 and a second voltage-controlled oscillator 17, each of which forms part of a loop and is connected to a control circuit 22. The oscillators 16 and 17 oscillate at a frequency which substantially corresponds to the carrier frequency of the input signal. An input terminal 13 of control circuit 22, to which input an OQPSK input signal is applied, is connected to a first input of both a first adder circuit 14 and a second adder circuit 15. The oscillator signal of the second oscillator 17, shifted 90° by a first delay element 18, is applied to a second input of the first adder circuit 14. The sum of the signals applied to the two inputs of the first adder circuit 14 is applied to a first input of a first phase comparator circuit 20 to compare it with the oscillator signal of oscillator 16, which oscillator signal is applied to a second input of the first phase comparator circuit 20. The output signal of the first phase comparator circuit 20, which is a measure of the phase difference between the input signals applied thereto, is filtered by a first low-pass filter 21 and applied to a control input 23 of the first oscillator 16. Likewise, the oscillator signal of the first oscillator 16, shifted 90° by a second delay element 19, is applied to a second input of the second adder circuit 15. The sum of the signals applied to the two inputs of the second adder circuit 15 is applied to a first input of a second phase comparator circuit 24 to compare it with the oscillator signal of the second oscillator 17, which oscillator signal is applied to a second input of the second phase comparator circuit 24. The output signal of the second phase comparator circuit 24, which is also a measure of the phase difference between the two input signals applied thereto, if filtered by a second low-pass filter 25 and applied to a control input 26 of the second oscillator 17. The oscillator signals of the two oscillators 16 and 17 are further applied to a combining circuit 27, which is loaded by an impedance 28. Impedance 28 may be, for example, a transmitting aerial or the input impedance of an output circuit—not shown—which is to be connected to output terminal 29. Further power amplification and conversion, if necessary, to a desired radio frequency band, is carried out in this output circuit.

Figure 2B:
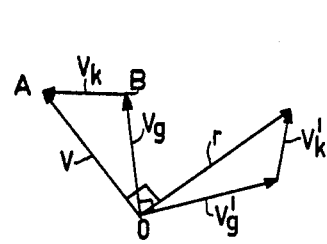

The arrangement shown in FIG. 2a will now be further explained, reference also being made to the vector diagram shown in FIG. 2b. Let the oscillator signal of oscillator 16 be $v'_k$ and the oscillator signal of oscillator 17 be $v'_g$. In addition, let the desired signal vector v be applied at a low power, in correspondence with OQPSK modulation, to input terminal 13. The signal at the output of adder circuit 14 is then equal to $v + v'_g e(-j\pi)/2$. In response to the phase control in control loop 17, 24, 25, the signal $v'_g$ is subjected to a 90° phase shift with respect to the signal $v_g$, so $v'_g = v_g \exp(-j\pi/2)$. It therefore holds that:

$$v + v'_g e(-j\pi/2) = v - v_g = v_k$$

In a similar manner it holds that:

$$v + v'_k e(-j\pi/2) = v - v_k = v_g$$

So, when the voltages $v_k$ and $v_g$ are generated from v, $v'_k$ and $v'_g$ then it is effected, by means of the two phase loops, that the output voltages $v'_g$ and $v'_k$, respectively, remain at a 90° angle with respect to the input voltages $v_g$ and $v_k$, respectively.

To generate high power, the input signal v, is supplied, at a low power, to high power oscillators, or, for example, an oscillator followed by a class-C amplifier controlled by this low-power input signal. An advantage is that co-operation of the two oscillators creates the possibility to introduce not only phase variations but also amplitude variations in the output signals, while the amplitudes of the signals to be amplified are constant, so that the non-linear amplitude transfer function of the components, for example class-C amplifiers, is no longer important.

The following points should be considered when implementing a circuit for the arrangement shown in FIG. 2a. For a proper operation, it is necessary that the phase loop can react quickly to variations in the input signal. The bandwidths of the low-pass filters 21 and 25 must therefore be relatively large. In addition, the loop gain must preferably also be large to keep deviations from the desired phase angles of 90° at a minimum. When this circuit is used to generate high power, the delay elements 18 and 19 must also comprise attenuators. It was further found that a 5:3 ratio between the amplitudes of $v_g$ and $v_k$ is an advantageous ratio. In that case an average of approximately 75% of the total power is produced by oscillator 17 and approximately 25% by oscillator 16.

Figure 2C:
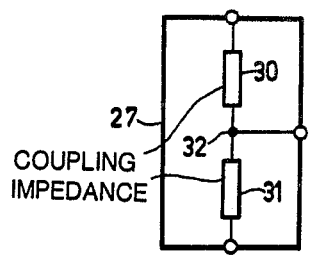

The output voltages $v'_k$ and $v'_g$ must be added together in a fixed ratio by output circuit 27. This is, for example, realized by connecting—as shown in FIG. 2c—the output of oscillator 16 to connecting point 32 via a coupling impedance 30 and the output of oscillator 17 also to connecting point 32 via a coupling impedance 31. In order to ensure that the components $v'_g$ and $v'_k$ contribute in the desired ratio towards the output signal, the coupling impedances 30 and 31 must be accurately equal to each other.

A disadvantage of the arrangement shown in FIG. 2a is that the precision which is required with respect to the equality of the coupling impedance 30 and 31 in the high-frequency range is difficult to realize. This results in noise components being introduced into the spectrum of the output signal. A further disadvantage is that, even when the coupling impedances 30 and 31 are perfectly equal to each other, difficulties may still occur as a result of the so-called interaction effect of the two oscillators 16 and 17. This is caused by the fact that, in general, the output voltage produced by an oscillator depends on the impedance by which it is loaded. Therefore, in FIG. 2a the impedance by which one oscillator is loaded depends on the voltage produced by the other oscillator. A phase control of oscillator 17, for example, will therefore produce a voltage variation in the oscillator 16. This effect is indeed reduced by the negative feed-back provided, but the magnitude of this interaction effect must be taken into consideration when rating the loop gain to be introduced therein, in order to be able to obtain the required precision.

Figure 3A:
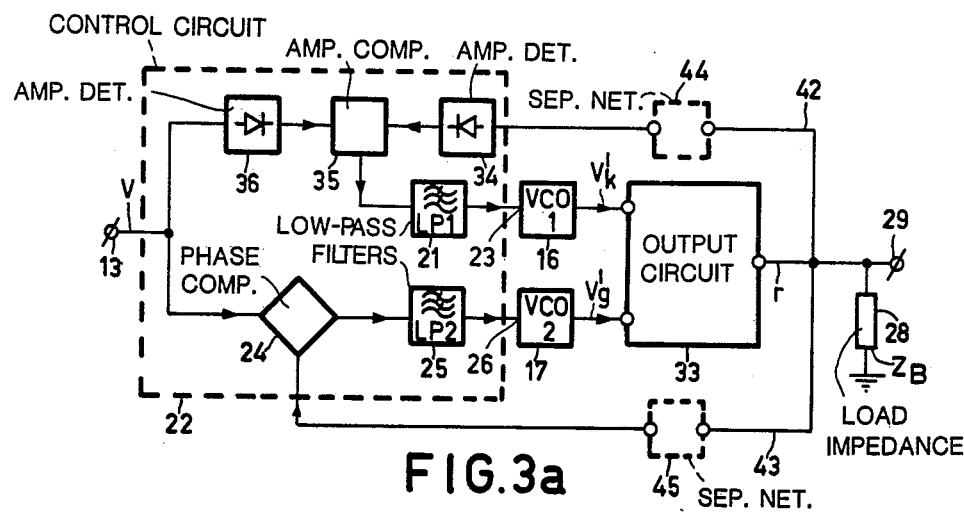
FIG. 3a is a block schematic circuit diagram of a second embodiment of an arrangement according to the invention.

The second embodiment of an arrangement for amplifying a modulated carrier signal is shown in FIG. 3a. In the embodiment shown in FIG. 2a, the information required for the two phase controls was derived directly from the output voltages of the individual oscillators, but in the second embodiment this information is derived from a point where the two components have already been combined, i.e. after assembly in an output circuit 33 at output 29. The relevant information must then be selected from the composite signal for each of the two oscillators. To this end, the phase of the oscillator signal $v'_k$, produced by oscillator 16, is controlled in such manner that the amplitude of output signal r is correct and the phase of the oscillator signal $v'_g$, produced by oscillator 17, is controlled in such manner that the phase of output signal r with respect to v is correct (90°). The first-mentioned object is accomplished by applying output signal r, after detection by a first amplitude detector 34 (for example a rectifier circuit), to an amplitude comparator circuit 35, to compare this output signal with the input signal v, which was processed by an amplitude detector 36. The oscillator 16 is adjusted to the correct value by means of the difference signal from amplitude-comparator circuit 35, which is applied to it via a low-pass filter 21. Simultaneously, the output signal r is compared with the input signal v in phase comparator circuit 24 and when there is deviation from the desired phase relationship of 90°, oscillator 17 is readjusted by applying the output signal of phase comparator circuit 24, after filtering in a low-pass filter 25, to the control input of oscillator 17. In this manner the resultant output signal r is made equal to the signal vector v, required for OQPSK-modulation, with the aid of phase and amplitude control from the final stage.

Figure 3B:
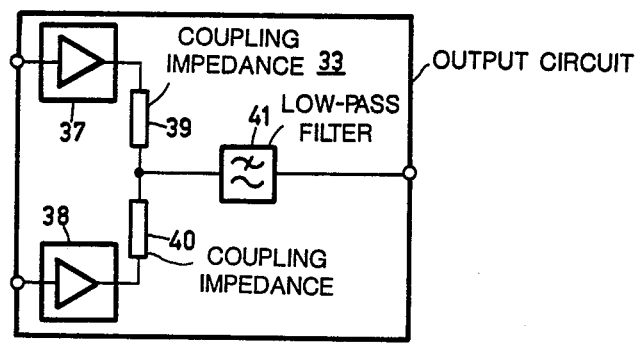
FIG. 3b shows an output circuit for use in the second embodiment.

FIG. 3b shows an embodiment of the output circuit 33 of the arrangement as shown in FIG. 3a. The output signal $v'_k$ from oscillator 16, which is of constant amplitude, is amplified by a class-C amplifier 37 and added to the output signal $v'_g$ from oscillator 17, also amplified by a class-C amplifier 38, by means of coupling impedances 39 and 40.

As mentioned in the foregoing, phase variations which are passed on to coupling impedance 40 via class-C amplifier 38, are introduced in oscillator 17 in synchronism with the information frequencies. In response thereto, the output impedance of class-C amplifier 37 varies and, as a result thereof, the composition of the higher harmonics changes. This means that the shape of the output signal is changed in such manner that the amplitude and the phase of the resulting signal r cannot be taken into account in the desired manner without further measures at the feedback. This produces extra side bands in the vicinity of the central frequency, that is to say an unwanted widening of the spectrum to be transmitted. In order to prevent this, a low-pass filter having a cut-off frequency of, for example 1.5 times the carrier frequency, may be included in the feedback leads 42, 43. As will be apparent from FIG. 3b only one low-pass filter 41 is used, namely by arranging it between the common junction point of the coupling impedances 39 and 40 and the load impedance 28. This has the additional advantage that the higher harmonics in the output signal are also suppressed.

Figure 3C:
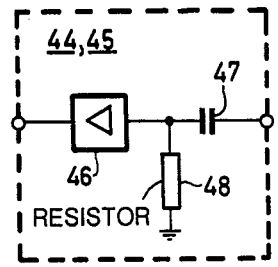
FIG. 3c shows a feed-back network for use in the second embodiment.

Separation networks 44 and 45 may be included in the return lines of the arrangement shown in FIG. 3a, the main object being the prevention of non-linear impedances in parallel with the output impedance 28. As shown in FIG. 3c, each separation network 44 and 45 comprises an isolation amplifier 46 and a coupling network consisting of a capacitor 47 in series with the return line and a resistor 48 between the input of amplifier 46 and ground.

The following should be noted as regards the implementation of the arrangement shown in FIG. 3a.

The arrangement shown in FIG. 3a is based on a simultaneous modulation of amplitude and phase. Requirements must be imposed on the synchronization of phase and amplitude modulation. Let the desired amplitude be a(t) and the desired phase $\theta$ (t), then in agreement with the input signal v(t):

$$v(t) = a(t)e^{j\theta(t)}$$

If there is a time difference $\tau$ between a(t) and $\theta$(t) then the output signal is given by $$v(t) = a(t-\tau)e^{j\theta(t)}$$

which will produce unwanted side bands in the transmitted spectrum. From a worst-case analysis, it appears that in order to keep the amplitude of the first component, which is located outside the desired spectrum, approximately 80 dB below the nominal amplitude, $f_b\tau$ must be less than $10^{-3}$. For $f_b = 16$ kb/s this means that $\tau < 60$ ns, wherein $f_b$ is the bit frequency of the digital information signal. In practice, the time delays $\tau_o$ and $\tau_o'$, respectively, of low-pass filters 21 and 25, respectively, which each have a cut-off frequency of approximately $5 \times f_b$, are of importance.

However, because of the feedback $1/(A_1+1)$ and $1/(A_2+1)$, respectively, the actual time delays $\tau_1$ and $\tau_2$, respectively, are smaller, where $A_1$ is the loop gain in the loop formed by the elements 21, 16, 42, 34 and 35 and $A_2$ is the loop gain in the loop formed by the elements 25, 17, 43 and 24.

When $\tau_1 = \tau_2$, then there is only a constant delay between the signals r and v. When $\tau_1$ and $\tau_2$ differ, then, in correspondence with the foregoing, in order to obtain 80 dB suppression, the following condition must be satisfied:

$$\left| \frac{\tau_0}{A_1+1} - \frac{\tau'_0}{A_2+1} \right| \cdot f_b < 10^{-3}$$

When the cut-off frequency of the low-pass filters 21 and 25 is chosen equal to five times the bit rate then the condition $$\tau_0 = \tau_0' = (10\pi f_b)^{-1}$$

changes into $$\left| \frac{1}{A_1+1} - \frac{1}{A_2+1} \right| < 0.03,$$

which can be easily satisfied.

As was described for the arrangement shown in FIG. 2a, the 5:3 ratio between the amplitude of $v'_g$ and $v'_k$ is an advantageous ratio. This also holds for FIG. 3a. However, if so desired, the stability of the loop of which oscillator 16 forms a part, can be increased by choosing a greater amplitude for $v'_k$. As will be apparent from the vector diagram shown in FIG. 1b, this reduces the required variation of the angle between $v_g$ and $v_k$. The stability of the loop of which oscillator 17 forms a part, is only endangered when the amplitude of the input signal becomes too small. As is also apparent from FIG. 1b, this is avoided as the signal vector is always in an area for which it holds: $|v| > R_1$. So, choosing a higher value of $v_k$ has an advantageous influence on the first-mentioned loop, while the stability of the last-mentioned loop is not endangered.

If so required, $v'_k$ may be chosen equal to $v'_g$, although this will not be so desirable because of the fact that then two high-power oscillators are required.

Figure 4:
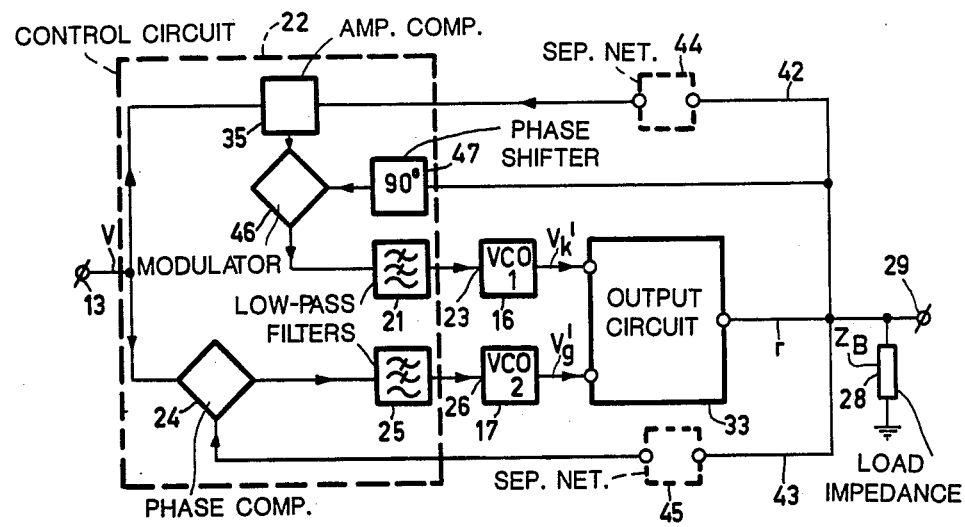
FIG. 4 is a block schematic circuit diagram of a third embodiment of an arrangement according to the invention.

FIG. 4 shows a variant of the embodiment shown in FIG. 3a; more particularly, in accordance with this FIG. 4, the amplitude difference between the signal vectors v and r is not measured by means of two amplitude detectors (34, 36) but rather by means of a modulator 46. The signal vectors v and r have almost the same phase and consequently the difference between the two (high-frequency) components, which difference is available at the output of amplitude comparator circuit 35, may be applied to the modulator 46 to which a carrier is applied which has approximately the same phase as v or r. The action of the fed-back VCO causes the carrier phase of r to differ by approximately 90° from the carrier phase of v. When a 90° shifting network 47 is used, the desired phase of the carrier for modulator 46 is obtained. The differential voltage detected by the modulator 46 is applied to low-pass filter 21 and processed in the manner described in the foregoing.

It should be noted that combining the output signals of the generator 16 and 17 can not only be carried out in the manner as shown, for example, in FIG. 2c, but that it can alternatively be done by means of a hybrid circuit. This results, however, in a loss of approximately 3 dB.

What is claimed is:

1. An arrangement for generating an amplified modulated carrier signal the amplitude variations of which are smaller than the amplitude of the unmodulated carrier, characterized in that said arrangement comprises a first and a second controlled power oscillator, each having a control input and an output, and a control circuit connected to the respective control inputs of said first and second controlled power oscillators for making said oscillators oscillate at a substantially constant amplitude and at a frequency which substantially corresponds to the carrier frequency, the outputs of said oscillators being coupled to the control circuit for generating control signals for the oscillators from comparisons between the modulated carrier signal and the oscillator signals, the arrangement also comprising an output circuit connected to the outputs of the oscillators for vectorially assembling an output signal which is said amplified modulated carrier signal.

2. An arrangement as claimed in claim 1, characterized in that, the control circuit comprises a first and a second phase comparator circuit, and a first and a second low-pass filter, each of said phase comparator circuits having a first and a second input and an output, the output of the first oscillator being connected to the second input of the first phase comparator circuit and the output of the first phase comparator circuit being connected to the control input of the first oscillator through the first low-pass filter, the output of the second oscillator being connected to the second input of the second phase comparator circuit and the output of this second phase comparator circuit being connected to the control input of the second oscillator through the second low-pass filter; that the control circuit further comprises a first and a second adder circuit, and a first and a second delay element, each of said adder circuits having a first and a second input and an output, the first inputs of the two adder circuits being interconnected and connected to an input of the arrangement, the second input of the first adder circuit being connected to the output of the second oscillator through the first delay element and the output of the first adder circuit being connected to the first input of the first phase comparator circuit, and the second input of the second adder circuit being connected to the output of the first oscillator through the second delay element and the output of the second adder circuit being connected to the first input of the second phase comparator circuit.

3. An arrangement as claimed in claim 1, characterized in that the control circuit comprises a phase comparator circuit, an amplitude comparator circuit, a first and a second low-pass filter, and a first and a second return line, each of said phase and amplitude comparator circuits having a first and a second input and an output, with the amplitude comparator circuit including a first and a second amplitude detector, the output circuit being connected to the second input of the phase comparator circuit through the second return line and the output of the phase comparator circuit being connected to the control input of the second oscillator through the second low-pass filter, the output circuit further being connected to the second input of the amplitude comparator circuit through the first return line and via the first amplitude detector, the output of the amplitude comparator circuit being connected to the control input of the first oscillator through the first low-pass filter, the input of the second amplitude detector being connected to the first input of the phase comparator circuit and to an input of the arrangement and the output of the second amplitude detector being connected to the first input of the amplitude comparator circuit.

4. An arrangement as claimed in claim 1, characterized in that the control circuit comprises a phase comparator circuit, an amplitude comparator circuit, a first and a second low-pass filter and a first and a second return line, each of said phase and amplitude comparator circuits having a first and a second input and an output, the output circuit being connected to the second input of the phase comparator circuit through the second return line and the output of the phase comparator circuit being connected to the control input of the second oscillator through the second low-pass filter; the output circuit also being connected to the second input of the amplitude comparator circuit by means of the first return line and the first input of this amplitude comparator circuit being connected to an input of the arrangement and to the first input of the phase comparator circuit; the control circuit further comprising a modulator and a phase shifting network, the modulator having a first and a second input and an output, the output of the amplitude comparator circuit being connected to the first input of the modulator and the output circuit being connected to the second input of the modulator via the phase shifting network, and the output of the modulator being connected to the control input of the first oscillator through the first low-pass filter.

5. An arrangement as claimed in claim 3 or 4, characterized in that the output circuit comprises a first and a second class-C amplifier, a first and a second coupling impedance and a third low-pass filter, the input of the first amplifier being connected to the output of the first oscillator and the input of the second amplifier being connected to the output of the second oscillator, the input of the third low-pass filter being connected to the output of the first amplifier through the first coupling impedance and to the output of the second amplifier through the second coupling impedance, the output of the third low-pass filter being connected to the output of the output circuit.

6. An arrangement as claimed in claim 3 or claim 4, characterized in that the first and the second return line each have an isolating amplifier and a coupling network therein.

7. An arrangement as claimed in claim 5, characterized in that the first and the second return lines each have an isolating amplifier and a coupling network therein.

* * * * *